United States Patent
Ishizu

(10) Patent No.: US 9,954,202 B2
(45) Date of Patent: Apr. 24, 2018

(54) METHOD FOR MANUFACTURING ELECTROLUMINESCENT DISPLAY DEVICE

(71) Applicant: JOLED INC., Tokyo (JP)

(72) Inventor: Katsuyuki Ishizu, Shiga (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/120,762

(22) PCT Filed: Dec. 24, 2014

(86) PCT No.: PCT/JP2014/006425
§ 371 (c)(1),
(2) Date: Aug. 23, 2016

(87) PCT Pub. No.: WO2015/128920
PCT Pub. Date: Sep. 3, 2015

(65) Prior Publication Data
US 2017/0005298 A1    Jan. 5, 2017

(30) Foreign Application Priority Data
Feb. 25, 2014  (JP) ................. 2014-033751

(51) Int. Cl.
*H01L 51/56*       (2006.01)
*G01R 31/44*       (2006.01)
(Continued)

(52) U.S. Cl.
CPC ............. *H01L 51/56* (2013.01); *G01R 31/44* (2013.01); *G09G 3/3241* (2013.01); *H01L 22/20* (2013.01);
(Continued)

(58) Field of Classification Search
CPC ...................................................... G01R 31/44
(Continued)

(56) References Cited

U.S. PATENT DOCUMENTS 6,859,193 B1 * 2/2005 Yumoto ............... G09G 3/3216
315/169.3
7,145,533 B2   12/2006 Imamura
(Continued)

FOREIGN PATENT DOCUMENTS

JP      2003-178871       6/2003
JP      2003-263128       9/2003
(Continued)

OTHER PUBLICATIONS

Translation of JP2003-178871 Jun 27, 2003.*
(Continued)

*Primary Examiner* — Christopher Mahoney
(74) *Attorney, Agent, or Firm* — Greenblum & Bernstein, P.L.C.

(57) ABSTRACT

A plurality of pixels arranged in a matrix each include an EL element, a transistor, and a transistor. The EL element includes a cathode to which a first voltage is applied. The transistor includes a gate connected to a gate signal line, a source connected to an anode of the EL element, and a drain to which a second voltage having a potential higher than a potential of the first voltage is applied. A method for manufacturing the EL display device includes: applying the second voltage to the anode of the EL element via the transistor, by applying an ON voltage to the gate signal line; and detecting light emission by the EL element, using an optical detector, in a state in which the ON voltage is being applied to the gate signal line.

12 Claims, 11 Drawing Sheets

(51) Int. Cl.
*G09G 3/3241* (2016.01)
*H01L 21/66* (2006.01)
*H01L 27/32* (2006.01)

(52) U.S. Cl.
CPC . *H01L 27/3244* (2013.01); *G09G 2300/0814* (2013.01); *G09G 2300/0819* (2013.01); *G09G 2300/0842* (2013.01); *G09G 2300/0866* (2013.01); *G09G 2310/0262* (2013.01); *G09G 2320/043* (2013.01); *G09G 2330/08* (2013.01); *G09G 2330/12* (2013.01); *G09G 2340/06* (2013.01); *H01L 2227/323* (2013.01); *H01L 2251/568* (2013.01)

(58) Field of Classification Search
USPC ........................................................ 324/414
See application file for complete search history.

(56) References Cited

U.S. PATENT DOCUMENTS

| | | | |
|---|---|---|---|
| 8,212,581 | B2 | 7/2012 | Levey et al. |
| 8,223,094 | B2 | 7/2012 | Nakamura et al. |
| 8,552,940 | B2 | 10/2013 | Nakamura et al. |
| 9,121,914 | B2 | 9/2015 | Shimamura et al. |
| 2003/0169220 | A1 | 9/2003 | Tsuchiya et al. |
| 2005/0258769 | A1 | 11/2005 | Imamura |
| 2010/0149140 | A1 | 6/2010 | Nakamura et al. |
| 2011/0074429 | A1 | 3/2011 | Levey et al. |
| 2012/0249612 | A1 | 10/2012 | Nakamura et al. |

FOREIGN PATENT DOCUMENTS

| | | |
|---|---|---|
| JP | 2005-331744 | 12/2005 |
| JP | 2008-052111 | 3/2008 |
| JP | 2010-250085 | 11/2010 |
| JP | 2010-281874 | 12/2010 |
| JP | 2013-506873 | 2/2013 |
| JP | 2013-101401 | 5/2013 |

OTHER PUBLICATIONS

Translation of JP2010-250085 Nov 4, 2010.*
International Search Report (ISR) from International Searching Authority (Japan Patent Office) in International Pat. Appl. No. PCT/JP2014/006425, dated Mar. 31, 2015.

* cited by examiner

METHOD FOR MANUFACTURING ELECTROLUMINESCENT DISPLAY DEVICE

TECHNICAL FIELD

The present disclosure relates to a method for manufacturing an electroluminescent (EL) display device.

BACKGROUND ART

In recent years, an active matrix (hereinafter occasionally abbreviated to AM) EL display panel including organic EL elements arranged in a matrix, and an EL display device including the EL display panel, have been commercialized.

The EL display panel includes pixels in each of which a plurality of transistors (TFT: thin film transistor) are disposed, and an organic EL light-emitting layer is disposed on the plurality of transistors. The EL display panel emits light as a result of supplying a current from the transistor to the organic EL light-emitting layer.

When a pixel of the EL display panel has a defect, the defect is in an EL element such as the organic EL light-emitting layer, or in a pixel circuit such as the TFT.

When a pixel with a defect is detected during, for example, a defect inspection process in manufacturing of EL display devices, the pixel is repaired in a defect repairing process.

CITATION LIST

Patent Literature

[PTL 1] Japanese Unexamined Patent Application Publication No. 2003-263128

SUMMARY OF INVENTION

Technical Problem

However, if it cannot be determined whether the defect is due to the organic EL light-emitting layer or due to the TFT in the above-described defect inspection process, it is difficult to repair the defect in the defect repairing process.

The present disclosure provides a method of manufacturing an EL display device which allows determining the possibility of repairing a defective pixel and a location of repairing the defective pixel.

Solution to Problem

A method of manufacturing an EL display device according to an aspect of the present disclosure is a method for manufacturing an EL display device that includes a display screen in which a plurality of pixels are arranged in a matrix, wherein the plurality of pixels each include an EL element, a driving transistor which supplies a current to the EL element, and a switching transistor, the EL element includes a first terminal to which a first voltage is applied, and a second terminal, and the switching transistor includes a gate terminal connected to a gate signal line, a third terminal connected to the second terminal, and a fourth terminal to which a second voltage is applied, the second voltage having a potential higher than a potential of the first voltage, the method including: applying the second voltage to the second terminal via the switching transistor, by applying an ON voltage to the gate signal line, and detecting light emission by the EL element, using an optical detector, in a state in which the ON voltage is being applied to the gate signal line.

Advantageous Effects of Invention

In a manufacturing process of an EL display panel, a lighting inspection for checking whether or not the panel is normally lighted is performed. According to the present invention, it is possible to determine whether a defect of the EL display panel is due to a defect of the organic EL light-emitting layer or a defect of the TFT, by performing the lighting inspection, enabling determining a location of repairing a defect and the possibility of repairing the defect. Accordingly, the defect can be precisely repaired, and thus it is possible to improve yield in panel manufacturing and to reduce manufacture costs.

DESCRIPTION OF EMBODIMENTS (Underlying Knowledge Forming the Basis of the Present Invention)

The inventor found that the following problems occur with the EL display device described in the "Background Art" section.

In the pixel circuit of the EL display device described in PTL 1, it is not possible to directly apply a voltage or the like to an EL element or a transistor of a pixel. In addition, since it cannot be determined whether a defect is due to the organic EL light-emitting layer or due to the TFT, it is not possible to determine how to repair the defect.

Embodiment

Hereinafter, an embodiment shall be described with reference to the drawings.

Figure 1:
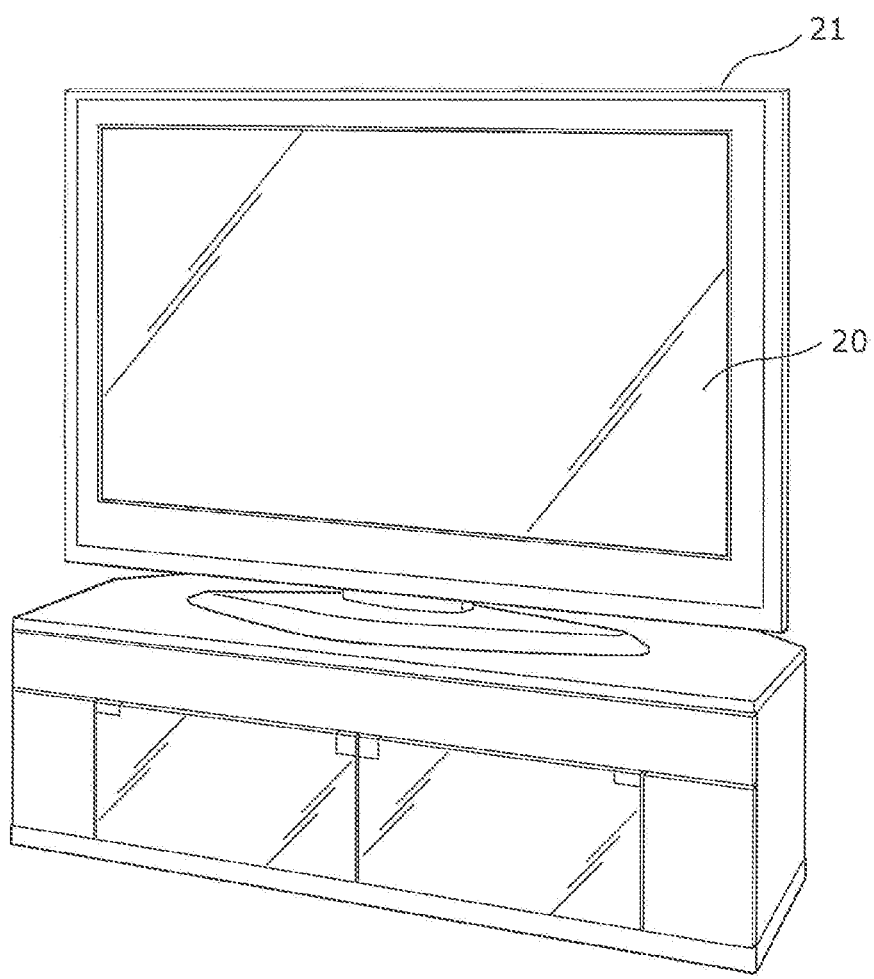
FIG. 1 is an external view of an EL display according to an embodiment.

The following describes a configuration of an organic EL display with reference to FIG. 1. FIG. 1 is an external view illustrating an example of an organic EL display panel according to the present embodiment. The organic EL display according to the present embodiment includes an EL display panel 21 which includes a display screen 20.

In the EL display panel 21 according to the embodiment of the present invention, EL elements of three primary colors of red (R), green (G), and blue (B) are arranged in a matrix.

It is possible to form color filters of red (R), green (G), and blue (B), corresponding to pixel positions. It should be noted that the color filter is not limited to RGB, and a pixel of cyanogen (C), magenta (M), or yellow (Y) may be formed. Furthermore, a pixel of white (W) may be formed. More specifically, pixels of R, G, B, and W are arranged in a matrix in the display panel.

It should be noted that R, G, and B may each have a different pixel aperture ratio. With the different aperture ratios, it is possible to have different current densities between currents flowing through the EL elements 15 of the respective RGB. With the different current densities, it is possible to equalize the deterioration rate of the EL elements 15 of the RGB. With the same deterioration rate, white balance shift does not occur in the EL display panel 21.

Furthermore, a pixel of white (W) is formed, as necessary. In other words, pixels include R, G, B, and W. With R, G, B, and W being included, high-luminance can be obtained. In addition, a pixel configuration of R, G, B, and G is also exemplified.

Colorization of the EL display panel 21 is realized by mask evaporation; however, colorization according to the embodiment of the present invention is not limited to the mask evaporation. For example, an EL layer which emits blue light is formed, and emitted blue light may be converted to light of R, G, and B, through a color conversion layer; that is, color change medium (CCM) of R, G, and B.

It should be noted that it is possible to dispose a circularly polarizing plate (circularly polarizing film) (not illustrated) on a light exit surface of the EL display panel 21. A polarization plate and a phase film are integrated into a circularly polarizing plate (circularly polarizing film).

[1. Configuration]
[1-1. Configuration of Light-Emitting Pixel]

Figure 12:
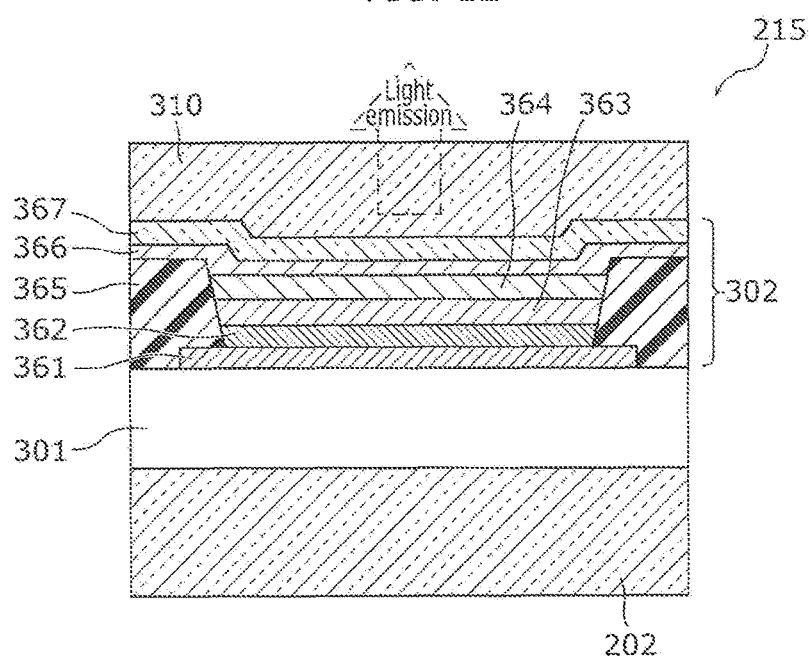
FIG. 12 is a diagram describing a configuration of a light-emitting element of an EL display device.

FIG. 12 is a cross-sectional view schematically illustrating an example of the configuration of a light-emitting pixel.

A light-emitting pixel 215 illustrated in FIG. 12 includes a substrate 202, a drive circuit layer 301, a light-emitting layer 302, and a transparent sealing film 310.

The EL display panel 21 according to the present embodiment is an EL display device including the display screen 20 in which light-emitting pixels 215 are arranged in a matrix.

The substrate 202 is a plate-like component on which a plurality of light-emitting pixels 215 are arranged in a matrix, and is a glass substrate, for example. It should be noted that, for example, a flexible substrate formed of a resin may be used as the substrate 202. The drive circuit layer 30 including a thin film transistor (TFT) is disposed on a surface of the substrate 202. It should be noted that, when a top emission structure illustrated in FIG. 12 is employed, substrate 202 need not necessarily be transparent, and thus a non-transparent substrate such as a silicon substrate may be used.

Figure 3:
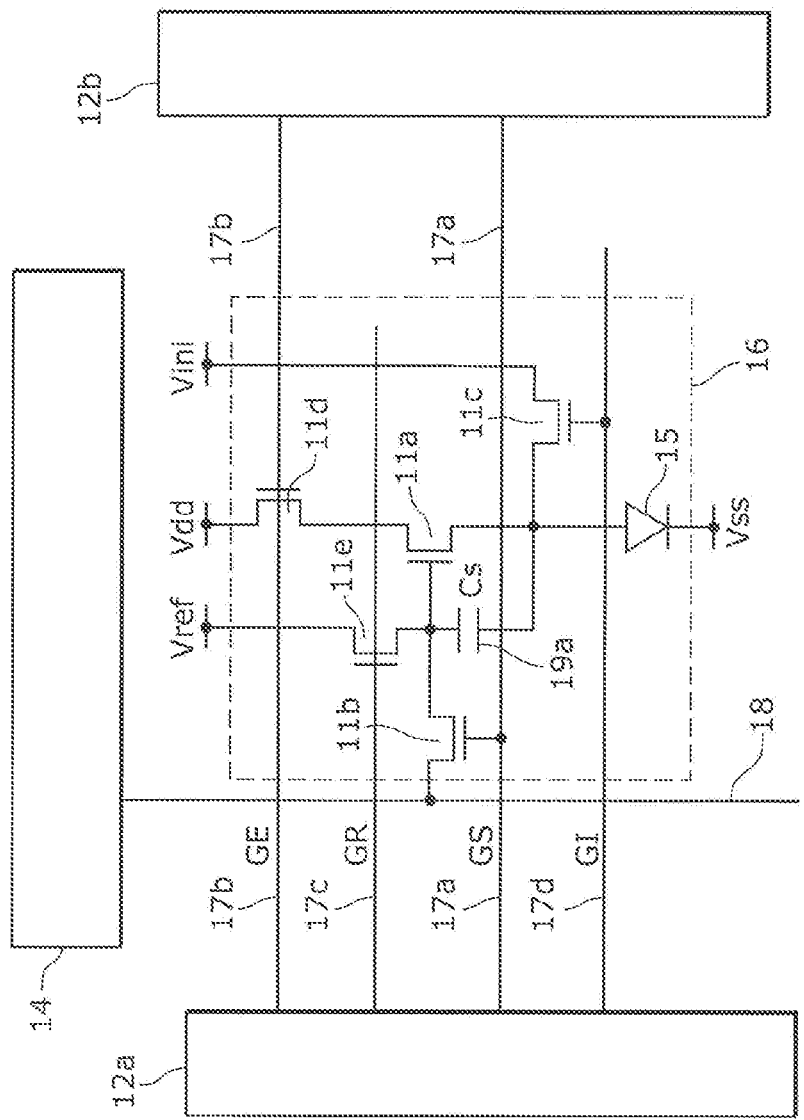
FIG. 3 is a diagram illustrating an example of a pixel circuit included in the EL display device according to the embodiment.

The drive circuit layer 301 includes a drive transistor (a transistor 11a in FIG. 3) disposed on the substrate 202, a capacitor (a capacitor 19a in FIG. 3), and a selection transistor (a transistor 11b in FIG. 3). The drive circuit layer 301 has an upper surface having flatness ensured by a planarizing film.

The light-emitting layer 302 is a layer which forms the EL element 15 illustrated in FIG. 3 that will be described later. The light-emitting layer 302 includes an anode 361, a hole injection layer 362, a hole transport layer 363, an organic light-emitting layer 364, a bank layer 365, an electron injection layer 366, and a transparent cathode 367.

The light-emitting pixel 215 illustrated in FIG. 12 has the top emission structure. When a voltage is applied to the light-emitting layer 302, light is generated in the organic light-emitting layer 364, and part of the light travels upwardly through the transparent cathode 367 and the transparent sealing film 310 and exits the light-emitting pixel 215. In addition, part of the light generated in the organic light-emitting layer 364 which travels downwardly is reflected off the anode 361, and travels upwardly through the transparent cathode and the transparent sealing film 310 and exits the light-emitting pixel 215.

The anode 361 is an electrode which is disposed on a surface of the planarizing film of the drive circuit layer 301, and applies, to the light-emitting layer 302, a voltage that is positive with respect to a voltage of the transparent cathode 367. As an anode material for the anode 361, for example, it is preferable to employ Al or Ag which is a metal having a high reflectance, or an alloy of Al or Ag. The thickness of the anode 361 is 100 nm to 300 nm, for example.

The hole injection layer 362 is disposed on a surface of the anode 361, and has a function of injecting a hole into the organic light-emitting layer 364 stably or assisting generation of the hole. In this manner, a drive voltage of light-emitting layer 302 is decreased, and life of the element is increased by stabilized hole injection. As a material of the hole injection layer 362, polyethylenedioxythiophene (PEDOT) may be used, for example. In addition, the thickness of the hole injection layer 362 is approximately 10 nm to 100 nm, for example.

The hole transport layer 363 is disposed on a surface of the hole injection layer 362, and has functions of efficiently transporting, to the organic light-emitting layer 364, the hole injected from the hole injection layer 362, preventing deactivation of an exciton at the interface between the organic light-emitting layer 364 and the hole injection layer 362, and blocking an electron. An example of a material of the hole transport layer 363 includes an organic polymeric material, such as triphenylamine and polyaniline, which has a property of transmitting the generated hole by charge-transfer reaction between molecules. In addition, the thickness of the hole transport layer 363 is approximately 5 nm to 50 nm, for example.

It should be noted that there are instances where the hole transport layer 363 is replaced with a material of the hole injection layer 362 or the organic light-emitting layer 364 which are layers adjacent to the hole transport layer 363.

The organic light-emitting layer 364 is disposed on a surface of the hole transport layer 363, and has a function of generating an excited state and emitting light by holes and electrons being injected and re-combined. For the organic light-emitting layer 364, not only a low-molecular organic material but also a luminescent polymeric organic material which can be formed by a wet film forming method such as an ink-jet method and a spin coat method is also applicable. Features of the EL display device include a simple device configuration, excellent film reliability, and low voltage driving, when the polymeric organic material is employed for the organic light-emitting layer 364. A pi-conjugated polymer or a polymer having a conjugate system such as an aromatic ring or a condensed ring is fluorescent, and thus can be used as a polymeric organic material included in the organic light-emitting layer 364. An example of a polymeric light-emitting material included in the organic light-emitting layer 364 includes polyphenylene vinylene (PPV) or a derivative thereof (i.e., PPV derivative), polyfluorene (PFO) or a derivative thereof (i.e., PFO derivative), a polyspirofluorene derivative, etc. In addition, it is also possible to use polythiophene or a derivative thereof.

The bank layer 365 is disposed on a surface of the drive circuit layer 301 or the anode 361, and serves as a bank for forming, in a predetermined region, the hole transport layer 363 and the organic light-emitting layer 364 which are formed using the wet film forming method. Although a material for use in the bank layer 365 may be an inorganic substance or an organic substance, the organic substance is more water repellent in general, and thus can be used more preferably. An example of such a material includes a resin such as polyimide and acrylic polymer. The thickness of the bank layer 365 is approximately 100 nm to 3000 nm, for example.

The electron injection layer 366 is disposed on the organic light-emitting layer 364, and has a function of decreasing a drive voltage of the light-emitting layer 302 by lowering a barrier to injection of an electron to the organic light-emitting layer 364, and reducing deactivation of an exciton. In this manner, it is possible to stabilize injection of an electron and increase life of the element, and to improve the uniformity of the light-emitting surface by increasing adhesion to the transparent cathode 367 and decrease a defect of the element. Although not strictly limited, the electron injection layer 366 preferably includes barium, aluminum, phthalocyanine, lithium fluoride, and further, a barium-aluminum laminated body, etc. The thickness of the electron injection layer 366 is approximately 2 nm to 50 nm, for example.

The transparent cathode 367 is disposed on a surface of the electron injection layer 366, and has a function of applying, to the light-emitting layer 302, a voltage which is negative with respect to a voltage of the anode 361, and injecting an electron to the element (specifically, to the organic light-emitting layer 364). Although not strictly limited, it is preferable to use a substance and configuration having a high transmittance for the transparent cathode 367. With this, it is possible to implement a top-emission organic EL element having high luminescence efficiency. Although not strictly limited, a metal oxide layer is employed as the transparent cathode 367. As the metal oxide layer, although not strictly limited, a layer including indium tin oxide (hereinafter referred to as ITO) or indium zinc oxide (hereinafter referred to as IZO) is employed. In addition, the thickness of the transparent cathode 367 is approximately 5 nm to 200 nm, for example.

The transparent sealing film 310 is disposed on a surface of the transparent cathode 367, and has a function of protecting the element from moisture. In addition, the transparent sealing film 310 needs to be transparent. The transparent sealing film 310 is formed of, for example, SiN, SiON, or an organic film. In addition, the thickness of the transparent sealing film 310 is approximately 20 nm to 5000 nm, for example.

With the above-described configuration of the light-emitting pixel 215, the EL display panel 21 serves as an active-matrix EL display device.

In the pixel circuit shown in FIG. 3 which will be described later, when a scanning signal is provided to the gate signal line 17a and the transistor 11b is turned on, a voltage corresponding to a signal voltage supplied via the source signal line 18 is applied to the capacitor 19a. Then, a hold voltage corresponding to the signal voltage applied to the capacitor 19a is held for one frame period, the hold voltage changes the conductance of the transistor 11a in an analog manner, and a drive current corresponding to a light-emitting gradation is supplied to the anode of the EL element 15. In addition, the drive current supplied to the anode of the EL element 15 flows to the cathode of the EL element 15. This causes the EL element 15 to emit light to be displayed as an image. At this time, a forward bias voltage corresponding t o the signal voltage is applied to the anode of the EL element 15.

It should be noted that the circuit configuration of the light-emitting pixel described above is not limited to the circuit configuration illustrated in FIG. 3. Although the transistor 11b and the transistor 11a are elements of the a circuit configuration necessary for forwarding the drive current corresponding to the signal voltage to the EL element 15, the circuit configuration is not limited to the configuration described above. In addition, the case where another circuit configuration element is added to the above-described circuit configuration is also included in the light-emitting pixel circuit of the organic EL display device according to present disclosure.

[1-2. Overall Configuration]

Figure 2:
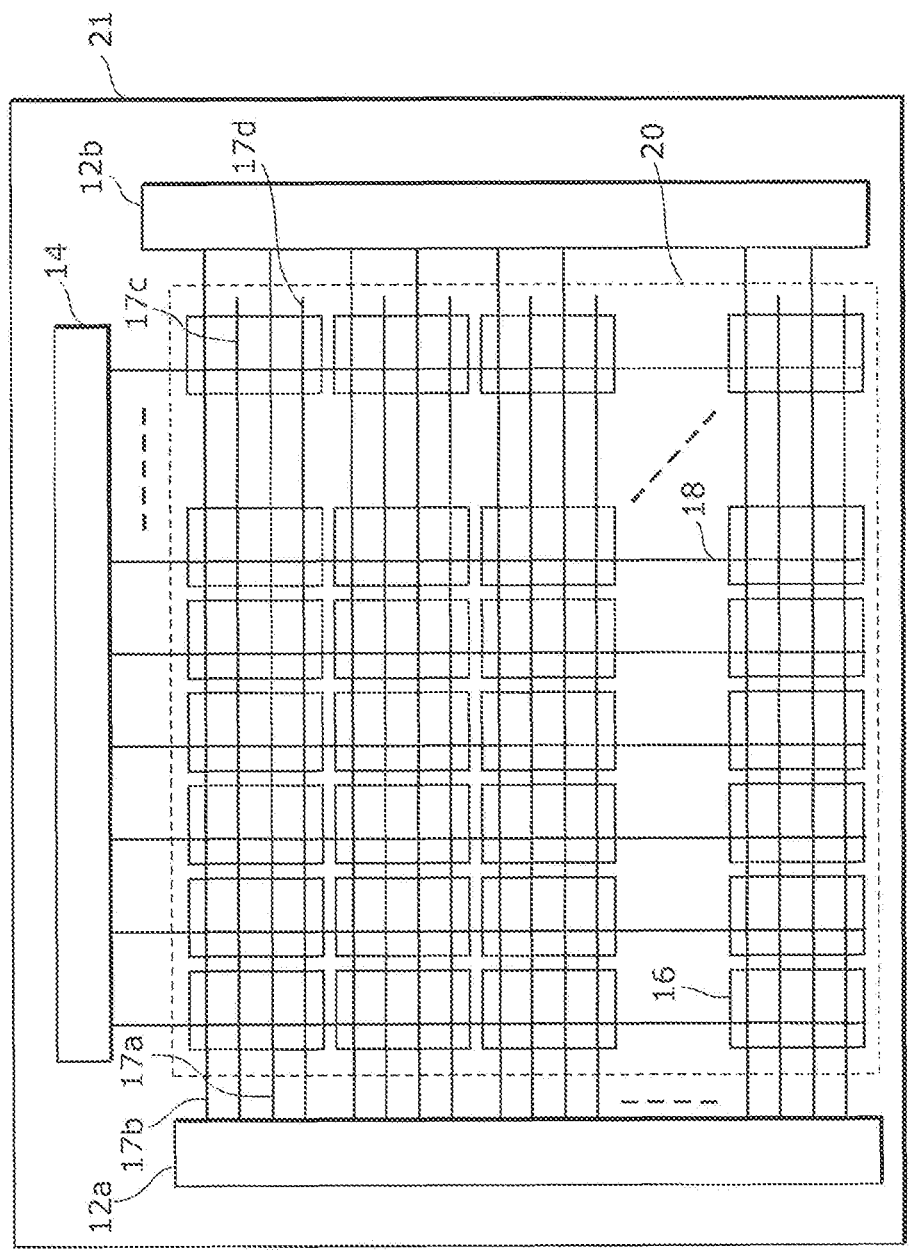
FIG. 2 is a configuration diagram of an EL display device according to the embodiment.

FIG. 2 is a block diagram illustrating an electrical configuration of EL display device according to the embodiment. As illustrated in FIG. 2, the EL display device according to the present embodiment includes: the display screen 20 in which the pixels 16 are arranged in a matrix; the gate signal lines 17a, 17b, 17c, and 17d which are disposed for each pixel row of the display screen 20; the source signal line 18 disposed for each pixel column of the display screen 20; gate driver circuits (gate driver ICs) 12a and 12b which are peripheral circuits of the display screen 20 for driving the gate signal lines 17a, 17b, 17c, and 17d; a source driver circuit (source driver IC) 14 for providing a video signal to the source signal line 18; and a control circuit (not illustrated) which controls the gate driver circuits 12a and 12b, the source driver circuit 14, etc. The display screen 20 displays an image according to a video signal provided to the image display apparatus from an external source.

The gate signal lines 17a, 17b, 17c, and 17d are connected to at least o one of the gate driver circuits 12a and 12b, and are connected to the pixels 16 which belong to a corresponding pixel row. The gate signal lines 17a, 17b, 17c, and 17d each have a function of controlling the timing of applying a signal voltage to the pixels 16 which belong to a corresponding pixel row, a function of controlling the timing of applying various voltages such as the initialization voltage and the reference voltage to the pixels 16, and the like.

The gate driver circuits 12a and 12b are connected to at least one of the gate signal lines 17a, 17b, 17c, and 17d, and output selection signals to the gate signal lines 17a, 17b, 17c, and 17d, thereby controlling conduction (ON) and non-conduction (OFF) of transistors included in the pixels 16.

For example, when an ON voltage is applied to the gate signal line 17a in the pixel circuit illustrated in FIG. 3 which will be described later, the transistor 11b is turned on, and a video signal applied to the source signal line 18 is applied to the pixel 16.

Gate driver circuits 12a and 12b are disposed to the left and to the right, respectively, of the display screen 20. According to an aspect of the embodiment illustrated in FIG. 2, each of the gate signal line 17a and the gate signal line 17b has ends to which the gate driver circuits 12a and 12b disposed to the left and to the right of the display screen 20 are connected. The gate signal lines 17c and 17d each have an end connected to the gate driver circuit 12a disposed to the left of the display screen 20. The gate driver circuits 12a and 12b are each mounted on a chip on film (COF) which is not illustrated. In particular, it is preferable that the gate signal line 17a (gate signal line GS) is connected to both of the gate driver circuits 12a and 12b.

The source signal line 18 is disposed for each of the pixel columns of the display screen 20. In other words, the source signal lines 18 corresponding to the number of pixel columns are disposed. The source signal lines 18 are each connected to the source driver circuit 14, and connected to the pixels 16 which belong to a corresponding one of the pixel columns.

The source driver circuit 14 is a drive circuit connected to one end of the source signal lines 18, and has a function of outputting a video signal to supply or apply the video signal to the pixels 16 via the source signal lines 18. The source driver circuit 14 is mounted on the chip on Film (COF) which is not illustrated.

The control circuit of which illustration is omitted is a control circuit which has a function of controlling the gate driver circuits 12a and 12b, and the source driver circuit 14. The control circuit may be configured so as to: include a memory (not illustrated) on which correction data, etc. of each of the EL elements 15 are recorded; read the correction data, etc. written in the memory; correct a video signal inputted from outside, on the basis of the correction data; and output the corrected video signal to the source driver circuit 14.

There are instances where the image display device illustrated in FIG. 2 requires various types of ON voltages (Von), and various types of OFF voltages (Voff). In addition, an initial voltage (Vini), a reference voltage (Vref), etc. are required according to the configuration of the pixel circuit.

[1-3. Pixel Configuration]

FIG. 3 is a diagram illustrating an example of the pixel circuit included in the EL display device according to the embodiment. It should be noted that, only one pixel of the pixels 16 is illustrated in FIG. 3 and the like. In practice, the pixels 16 are arranged in a matrix in the display screen 20. The pixel circuit illustrated in FIG. 3 includes: the EL element 15; the transistor 11a for supplying a drive current to the EL element 15; the transistor 11d; the transistor 11b; the transistor 11c; the transistor 11e; and the capacitor 19a. The display screen 20 includes pixels each having the EL element 15 are arranged in a matrix.

The transistor 11a is a drive transistor including a drain terminal electrically connected via a first switching transistor 11d to an anode voltage Vdd that is a first power line, and a source terminal electrically connected to an anode terminal of the EL element 15. The transistor 11a converts a voltage corresponding to a signal voltage applied between the gate terminal and the source terminal into a drain current corresponding to the signal voltage. Then, the transistor 11a supplies this drain current as a signal current to the EL element 15. The transistor 11a is formed of, for example, an n-type thin film transistor (n-type TFT).

The EL element 15 is a light-emitting element including an anode terminal that is a second terminal electrically connected to the source terminal of the transistor 11a, and a cathode terminal that is a first terminal electrically connected to a second power line. A voltage of the second power line is a cathode voltage Vss that is a fist voltage. The EL element 15 emits light on the basis of the magnitude of the signal current supplied by the transistor 11a. The magnitude of the signal current is determined by applying a video signal that is applied to the source signal line 18, to the pixel 16 by the transistor 11b.

The transistor 11d is a first switching transistor including: a gate terminal electrically connected to the gate signal line 17b; a source terminal electrically connected to the drain terminal of the transistor 11a; and a drain terminal electrically connected to the anode voltage Vdd that is the first power line. When an ON voltage is applied to the gate signal line 17d, the transistor 11d is turned on, and a light-emission drive current is supplied to the EL element 15 from the transistor 11a. It should be noted that the transistor 11d may be disposed or formed between the source terminal of the transistor 11a and the anode terminal of the EL element 15.

The transistor 11b is a second switching transistor including: a gate terminal electrically connected to the gate signal line 17a; a source terminal electrically connected to the gate terminal of the drive transistor 11a; and a drain terminal electrically connected to the source signal line 18.

The transistor 11c is a third switching transistor including: a gate terminal electrically connected to the gate signal line 17d; a source terminal that is a third terminal electrically connected to the anode terminal (second terminal) of the EL element 15 and to the source terminal of the transistor 11a; and a drain terminal that is a fourth terminal to which an initial voltage (initialization voltage, Vini) that is a second voltage is applied or supplied. The transistor 11c has a function of determining timing for applying the initial voltage (Vini) to the source terminal of the transistor 11a and one of the electrodes of the capacitor 19a.

The transistor 11e is a fourth switching transistor including: a gate terminal electrically connected to the gate signal line 17c; a source terminal electrically connected to the gate terminal of the transistor 11a; and a drain terminal to which a reference voltage (Vref) is applied or supplied. The transistor 11e has a function of determining timing for applying the reference voltage (Vref) to the gate terminal of the transistor 11a.

Here, a state of being electrically connected is a state in which a voltage pathway or a current pathway is formed or can be formed. For example, even when a fifth transistor is disposed between the transistor 11a and the transistor 11d, the transistor 11a and the transistor 11d are electrically connected. It should be noted that, in the Description of the present disclosure, there are instances where the term connect means electrically connect.

The channels of the transistors 11a to 11e are bidirectional and the names of the source terminal and the drain terminal are used for the purpose of facilitating the explanation, and thus the source terminal and the drain terminal may be switched. Furthermore, the source terminal and the drain terminal may be referred to as a first terminal and a second terminal, for example.

In addition, the transistors including the drive transistor 11a and the switching transistors 11b to 11e are described as thin-film transistors (TFTs); however, the transistors are not limited to the TFTs. The transistor may be an FET, a MOS-FET, a MOS transistor, or a bipolar transistor.

In addition, the transistor, etc. are not limited to thin-film elements, and may be transistors formed on a silicon wafer. For example, a transistor formed using a silicon wafer, removed, and transferred onto a glass substrate is exemplified. In addition, a display panel on which a transistor chip formed using a silicon wafer is mounted by bonding on a glass substrate is exemplified.

In addition, it is preferable that a lightly doped drain (LDD) structure is employed for the transistors 11a to 11e, for both cases of an n-type transistor and a p-type transistor.

In addition, the transistors 11a to 11e may be formed using any of high-temperature polycrystalline silicon (HTPS), low-temperature polycrystalline silicon (LTPS), continuous grain silicon (CGS), transparent amorphous oxide semiconductors (TAOS, IZO), amorphous silicon (AS), and infrared rapid thermal annealing (RTA).

In FIG. 3, transistors included in a pixel are all formed in an n-type. However, the transistors of the pixel are not limited to the n-type transistors according to the present invention. The transistors may be only the n-type transistors or only the p-type transistors. In addition, the transistors may include both of the n-type transistor and the p-type transistor. Furthermore, the transistors 11a may include both of the n-type transistor and the p-type transistor.

It is preferable that the transistor has a top gate structure. This is because the top gate structure reduces parasitic capacitance, and a gate electrode pattern of the top gate serves as a light shielding layer to shield light emitted from the EL element 15, making it possible to reduce malfunction of a transistor or an off-leakage current.

It is preferable, in the process to be carried out, that a copper line or a copper alloy line can be employed as a line material for the gate signal lines 17a to 17d or the source signal line 18, or for both of the gate signal lines 17a to 17d and the source signal line 18. This is because it is possible to reduce wiring resistance between the signal lines and to implement a larger EL display panel.

It is preferable that the gate signal lines 17a to 17d which are driven (controlled) by the gate driver circuits 12a and 12b have low impedance. Accordingly, the same holds true for a composition or a structure of each of the gate signal lines 17a to 17d.

In particular, it is preferable that a low-temperature poly silicon LTPS is employed. With the low-temperature poly silicon, the transistor has a top gate structure and small parasitic capacitance, and it is possible to manufacture the n-type and p-type transistors, and to use the copper line or the copper alloy line in the processes. It is preferable that, for the copper line, a three-layer structure of Ti—Cu—Ti is employed.

For the lines such as the gate signal lines 17a to 17d or the source signal line 18, it is preferable that a three-layer structure of Mo—Cu—Mo is employed when the transistors 11a to 11e are transparent amorphous oxide semiconductors TAOS.

In the pixel circuit illustrated in FIG. 3, the capacitor 19a is a capacitor including a first electrode electrically connected to the gate terminal of the transistor 11a and a second electrode electrically connected to the source terminal of the transistor 11a.

The capacitor 19a first stores a potential between the gate electrode and the source electrode (potential of the source signal line 18) of the driving transistor 11a in a steady state, while the transistor 11b is in a conducting state. The potential of the capacitor 19a is maintained even when the transistor 11b is subsequently placed into the off state, and thus the gate voltage of the transistor 11a is maintained.

It should be noted that the capacitor 19a is formed or disposed so as to overlap (stack) with the source signal line 18 and the gate signal lines 17a to 17d. In this case, layout flexibility is improved, a wider space can be secured between elements, and yield is improved.

A pixel electrode (for example, the anode 361 illustrated in FIG. 12) is formed on an insulating film deposed on the source signal line 18 and the gate signal lines 17a to 17d, or on an insulating film (planarization film) including an acrylic material.

In the EL display device illustrated in FIG. 2, when the pixel circuit illustrated in FIG. 3 is employed, the anode voltage Vdd, the cathode voltage Vss, the reference voltage (Vref), and the initialization voltage (Vini) are each commonly connected to all of the pixels 16, and to a voltage generating circuit (not illustrated). Furthermore, when a voltage resulting from adding a light emission starting voltage of the EL element 15 to a threshold voltage of the driving transistor 11a is greater than 0 V, the voltage Vini may be substantially the same voltage as the cathode voltage Vss. With this, the types of an output voltage of the voltage generating circuit (not illustrated) is reduced and the circuit is more simplified.

In the pixel circuit illustrated in FIG. 3, the following relationship is preferable: anode voltage Vdd>reference voltage Vref>cathode voltage Vss>initial voltage Vini. More specifically, for example, the anode voltage Vdd=10 to 18 (V), the reference voltage Vref=1.5 to 3 (V), the cathode voltage Vss=0.5 to 2.5 (V), and the initial voltage Vini=0 to −3 (V).

In the pixel circuit illustrated in FIG. 3, it is preferable that the gate signal line 17a and the gate signal line 17b are connected to the two gate driver circuits 12a and 12b, as illustrated in FIG. 2.

This is due to the subsequent reason.

The gate signal line 17a is connected to the transistor 11b. The transistor 11b is a transistor for writing a video signal onto the pixel 16, and thus it is necessary to turning on and off the transistor 11b at high speed (high slew rate operation). The gate signal line 17a is driven by the two gate driver circuits 12a and 12b, thereby implementing the high slew rate operation. It should be noted that, the gate driver circuit 12a is disposed to the left of the display screen 20 and the gate driver circuit 12b is disposed to the right of the display screen 20, for example.

The gate signal line 17b is connected to the transistor 11d. The transistor 11d is a transistor for performing an offset cancelling operation of the transistor 11a, and thus it is necessary to turning on and off the transistor 11d at high speed (high slew rate operation). The gate signal lines 17a and 17b are driven by the two gate driver circuits 12a and 12b (bilateral driving), thereby implementing the high slew rate operation. Accordingly, in the defect inspection, it is possible to successfully detect a position of a defective pixel without depending on a screen position of a pixel to be inspected. In addition, a high-speed defect inspection can be implemented.

The gate signal lines 17c and 17d are connected to the gate driver circuit 12a, which is one of the gate driver circuits. The transistor 11e is connected to the gate signal line 17c. The transistor 11e has a function of applying the reference voltage Vref to the transistor 11a.

The transistor 11c is connected to the gate signal line 17d. The transistor 11c has a function of applying the initial voltage Vini to the source terminal of the transistor 11a. A low slew rate is sufficient for the operation of turning on and off the transistor for applying the initial voltage Vini.

Accordingly, it is possible to obtain practically sufficient performance even when the gate signal lines 17c and 17d are driven by only the gate driver circuit 12a.

Figure 4:
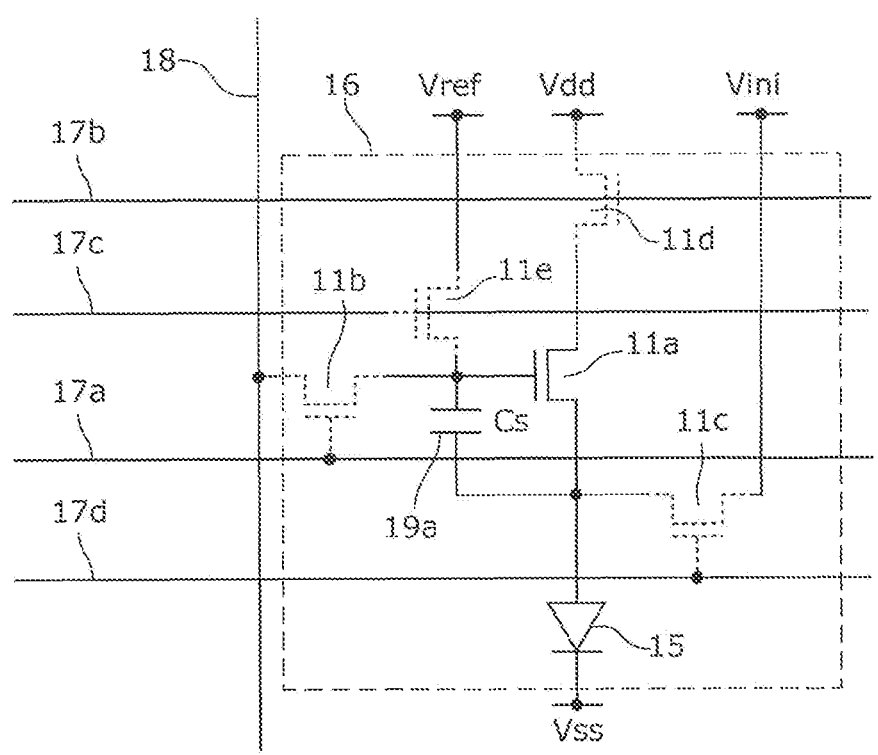
FIG. 4 is a circuit diagram illustrating a non-light-emitting period of the pixel circuit according to the embodiment.

It should be noted that, as illustrated in FIG. 4, the gate signal lines 17a to 17d may be driven by the two gate driver circuits 12a and 12b, and as with the pixel circuit illustrated in FIG. 3, the following relationship is preferable: anode voltage Vdd>reference voltage Vref>cathode voltage Vss>initial voltage Vini.

More specifically, for example, the anode voltage Vdd=10 to 18 (V), the reference voltage Vref=1.5 to 3 (V), the cathode voltage Vss=0.5 to 2.5 (V), and the initial voltage Vini=0 to −3 (V).

[1-4. Operation of Pixel Circuit]

Next, the operation of the pixel circuit illustrated in FIG. 3 shall be described with reference to FIG. 4 to FIG. 8, for example.

[1-4-1. Non-Light-Emitting Period]

In the pixel circuit illustrated in FIG. 3, when the transistor 11d is on, a current is supplied from the anode voltage Vdd to the EL element 15, to cause the EL element 15 to emit light (light-emitting period). A drive current (current between the drain and the source) is supplied from the anode voltage Vdd to the EL element 15 via the transistor 11a, and thus the EL element 15 emits light with luminance according to the drive current Id.

FIG. 4 is a circuit diagram illustrating a non-light-emitting period of the pixel circuit according to the embodiment. As illustrated in FIG. 4, a current flowing through the EL element 15 is interrupted by turning off the transistor 11d, and the EL element 15 stops emitting light (non light emission).

[1-4-2. Preparation Period for Offset Cancelling Correction]

Figure 5:
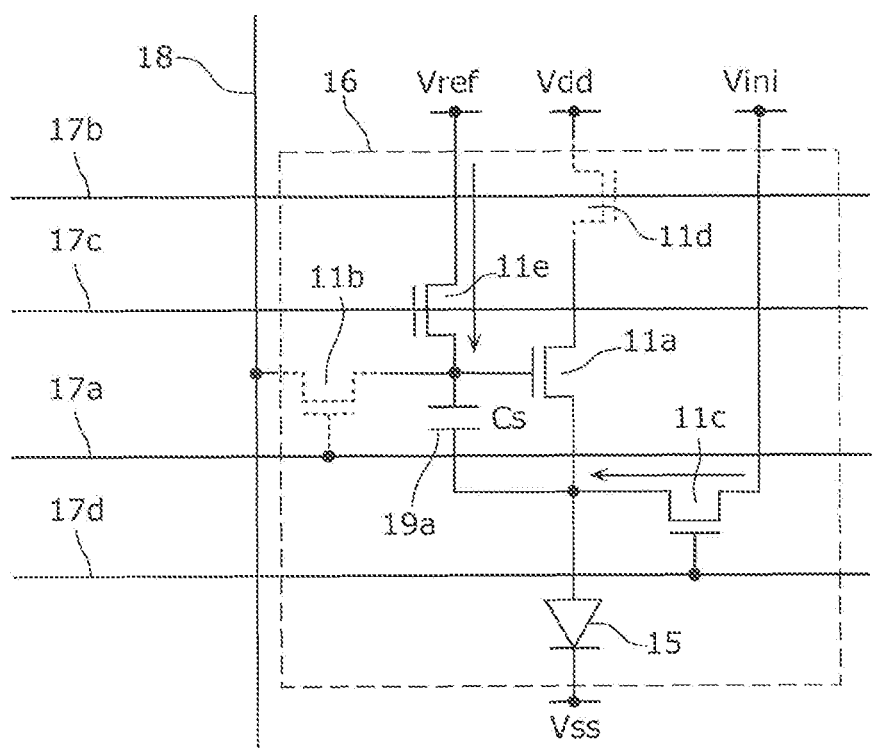
FIG. 5 is a circuit diagram illustrating a preparation period for offset cancelling correction of the pixel circuit according to the embodiment.

FIG. 5 is a circuit diagram illustrating a preparation period for offset cancelling correction of the pixel circuit according to the embodiment. In the preparation period for offset cancelling correction, the transistor 11e is turned on to apply the reference voltage Vref to the gate terminal of the transistor 11a, and the transistor 11c is turned on to apply the initial voltage Vini to the anode terminal of the EL element 15. In this manner, the gate potential Vg of the transistor 11a becomes the reference voltage Vref. In addition, the source potential Vs of the transistor 11a becomes the initial voltage Vini which is sufficiently lower than the reference voltage Vref.

Here, it is assumed that the initial voltage Vini is set such that the voltage between the gate and the source of the transistor 11a is higher than the offset cancelling voltage Vth of the transistor 11a. As described above, the gate potential Vg of the transistor 11a is initialized to the reference voltage Vref, and the source potential Vs of the transistor 11a is initialized to the low potential Vini, thereby completing the preparation for the offset cancelling correction operation.

[1-4-3. Offset Cancelling Correction Period]

Figure 6:
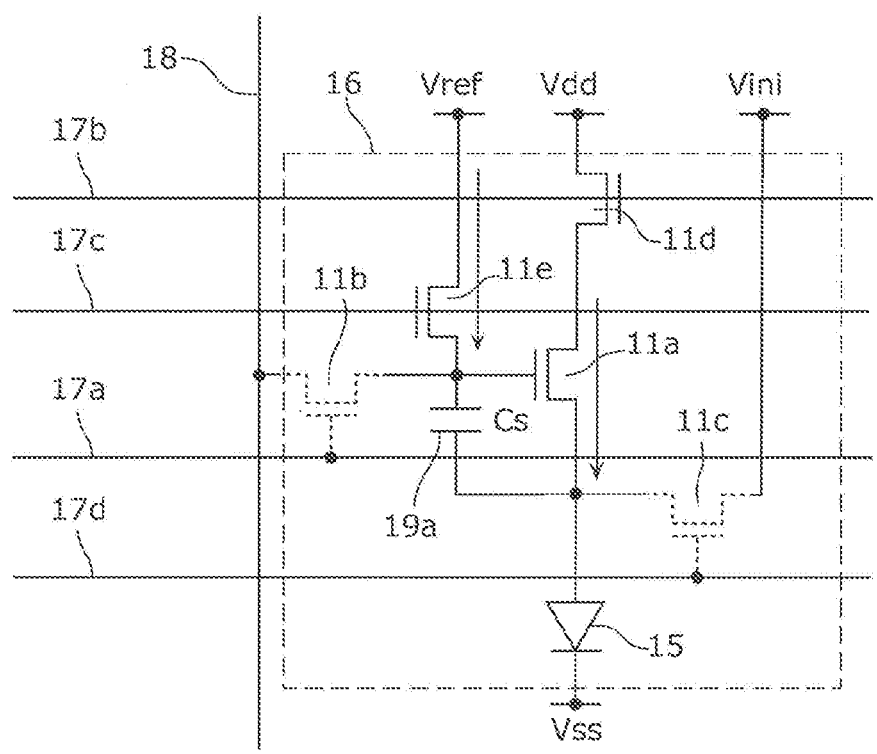
FIG. 6 is a circuit diagram illustrating an offset cancelling correction period of the pixel circuit according to the embodiment.

FIG. 6 is a circuit diagram illustrating an offset cancelling correction period of the pixel circuit according to the embodiment. As illustrated in FIG. 6, when the selection voltage (ON voltage) is applied to the gate signal line 17b to turn on the transistor 11d, the anode voltage Vdd is applied to the drain terminal of the transistor 11a. In addition, the transistor 11c is turned off. Then, the source potential Vs of the transistor 11a starts to increase. Subsequently, the voltage between the gate and the source Vgs of the transistor 11a becomes the offset cancelling voltage Vth of the transistor 11a, and a voltage corresponding to the offset cancelling voltage Vth is applied to the capacitor 19a.

Here, the period during which the voltage corresponding to the offset cancelling voltage Vth is applied to the capacitor 19a is referred to, for convenience, as an offset cancelling correction period.

It should be noted that, in order to cause a current to flow exclusively to the capacitor 19a and not to flow to the EL element 15 in the offset cancelling correction period, the cathode voltage Vss of the cathode electrode is set to place the EL element in a cutoff state. Accordingly, Vss is set to be higher than Vini. For example, when Vss=+2 (V), the Vini=−2 is exemplified.

Figure 7:
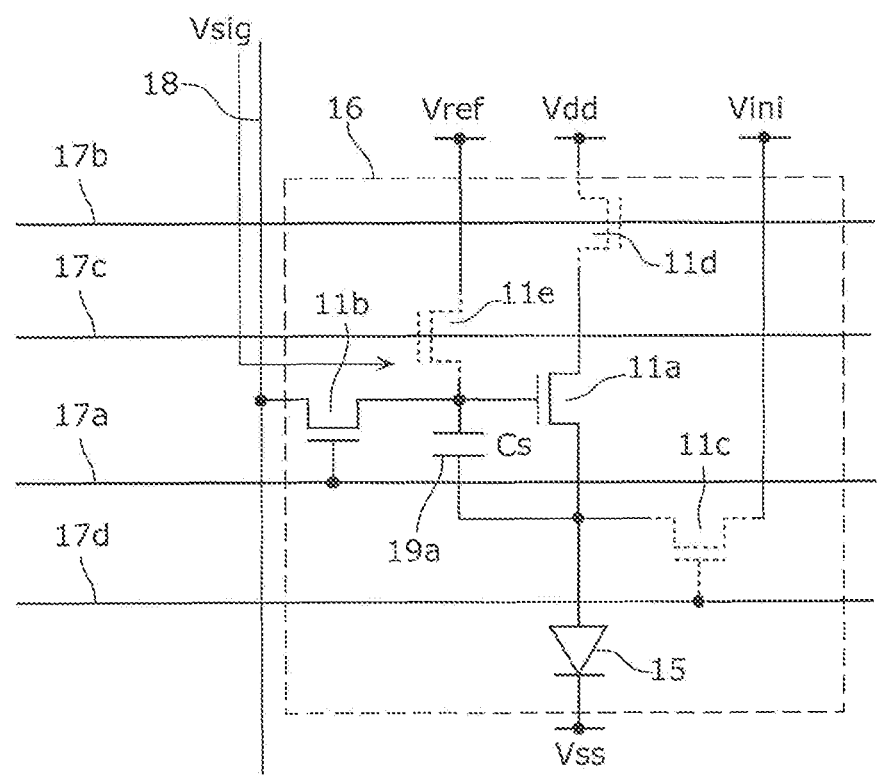
FIG. 7 is a circuit diagram illustrating a write period of the pixel circuit according to the embodiment.

Next, as illustrated in FIG. 7, the transistors 11d and 11e are turned off. At this time, although the gate of the transistor 11a is placed into a floating state, the voltage between the gate and the source Vgs is the same as the offset cancelling voltage Vth of the transistor 11a, and thus the transistor 11a is in the cutoff state. Accordingly, the current between the drain and the source Id does not flow.

[1-4-4. Write Period]

As illustrated in FIG. 7, a video signal voltage Vsig is applied from the source driver circuit 14 to the source signal line 18. The transistor 11b is placed in the conducting state by applying a selection voltage to the gate signal line 17a, and the video signal voltage Vsig is applied to the gate terminal of the transistor 11a of the pixel 16. According to the present embodiment, the EL element 15 is an EL element, and since the EL element 15 is in the cutoff state (high impedance state), the EL element 15 can be regarded as a capacitor (referred to as Cel).

Accordingly, the video signal voltage Vsig applied to the gate terminal of the transistor 11a is divided between the capacitance Cs of the capacitor 19a and the capacitance Cel of the light-emitting element, and applied between the gate terminal and the source terminal of the transistor 11a. Since the capacitance Cel of the light-emitting element is smaller than the capacitance of the capacitance Cs of the capacitor 19a, most of the video signal voltage Vsig is applied between the gate terminal and the source terminal of the transistor 11a.

It should be noted that, although the EL element 15 is used as the capacitance Cel according to the present embodiment, the present disclosure is not limited to this example. It should be understood that a capacitor may be separately disposed in parallel with the EL element 15.

[1-4-5. Light Emitting Period]

Figure 8:
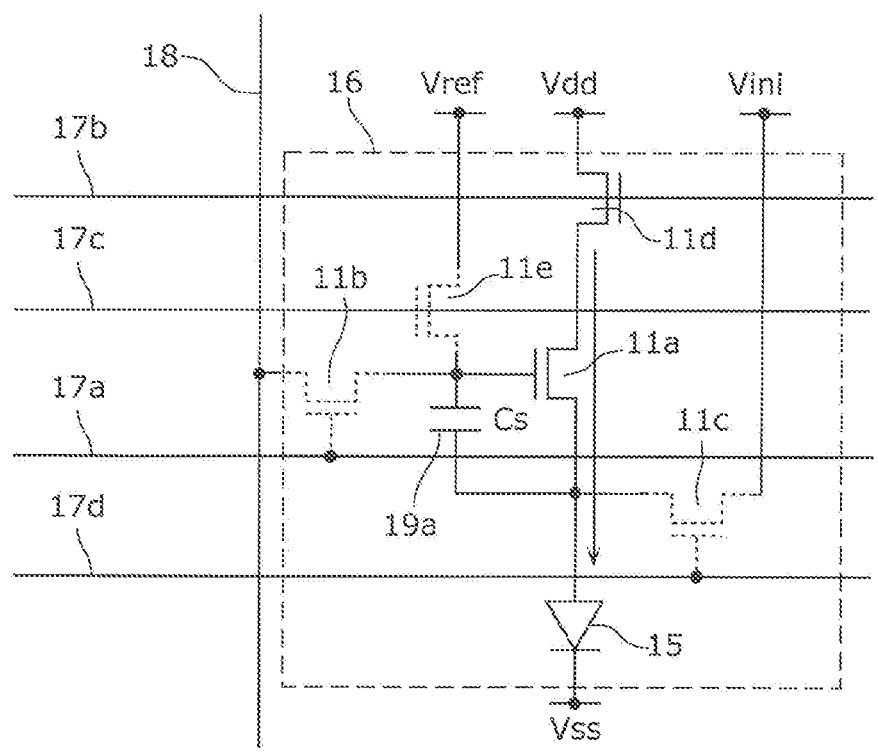
FIG. 8 is a circuit diagram illustrating a light emitting period of the pixel circuit according to the embodiment.

FIG. 8 is a circuit diagram illustrating a light emitting period of the pixel circuit according to the embodiment. As illustrated in FIG. 8, the anode voltage Vdd is applied to the drain terminal of the transistor 11a by turning on the transistor 11d. Upon application of the anode voltage Vdd, the current Id starts to flow. The EL element 15 emits light in proportion to the current Id.

In such a manner as described above, the offset cancelling correction is performed on the transistor 11a of each of the pixels 16, to control turning on and off of each of the pixels 16.

[1-5. Inspection Method]

Figure 9:
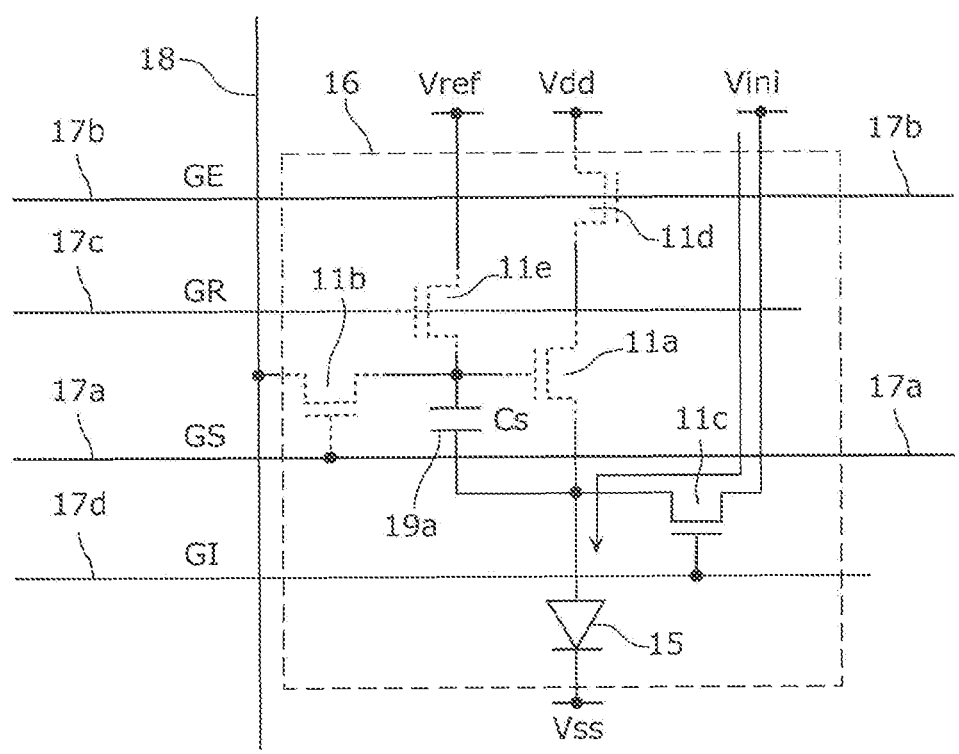
FIG. 9 is a diagram explaining a method of manufacturing the EL display device according to the embodiment.

FIG. 9 is a diagram explaining a method of manufacturing the EL display device according to the embodiment.

Whereas inspection of the EL display device is carried out according to the operation of the pixel circuit described in 1-4 in a normal lighting inspection, the EL element 15 is caused to emit light by turning off the transistors 11a, 11b, 11d and 11e, and turning on only the transistor 11c, to apply Vini to the drain terminal of the transistor 11c as illustrated in FIG. 9 in the lighting inspection according to the present disclosure.

The voltage Vini is applied to the anode terminal of the EL element 15 via the transistor 11c, by turning on the transistor 11c. When the EL element 15 operates normally, the EL element 15 emits light according to the voltage Vini applied to the anode terminal of the EL element 15. Here, a potential difference between the voltage Vini and the cathode voltage Vss is a voltage when a current flows through the EL element 15. Accordingly, when the cathode voltage Vss is +2 (V), for example, the voltage Vini is set to be +5 (V) or higher.

More specifically, the voltage Vini is applied to the anode terminal of the EL element 15 via the transistor 11c, by applying an ON voltage to the gate signal line 17a (voltage applying process).

Normally, in the offset cancelling operation, the initial voltage Vini=0 to −3 (V). In contrast, in the inspection illustrated in FIG. 9, the cathode voltage Vss is set to be +2 to +8 (V). When the cathode voltage Vss is +2 (V), the voltage Vini in the inspection is set to be 4 to 10 (V). For that reason, according to the present embodiment, two voltages can be set for the initial voltage Vini (at the time of the offset cancelling operation and at the time of the inspection [manufacturing]).

In addition, the initial voltage Vini can be manually varied at the time of inspection (manufacturing). The current that follows through the EL element 15 increases as the initial voltage Vini increases, and the current that follows through the EL element 15 decreases as the initial voltage Vini decreases. Accordingly, it is possible to judge whether the EL element 15 passes or fail, and determine the performance of the EL element 15, by optically checking the correlation between values of the initial voltage Vini and light emission luminance of the EL element 15.

In addition, the light emission luminance property and the terminal voltage of the EL element 15 vary according to the color (for example, red, green, or blue) of the EL element 15. According to the present embodiment, the initial voltage Vini can be separately set according to the color (red, green, or blue) of the EL element 15. It should be understood that the transistors 11c connected respectively to a red EL element, a green EL element, and a blue EL element can be separately operated, and the initial voltage Vini (R) for the red EL element, the initial voltage Vini (G) for the green EL element, and the initial voltage Vini (B) for the blue EL element can be separately adjusted or set.

As described above, in the case where the EL element 15 fails to emit light even when the initial voltage Vini is applied to the corresponding EL element 15 by turning on the transistor 11c, the EL element has a short-circuit defect in many cases. Accordingly, it is possible to detect a failure (defect) of the EL element 15, and to determine that a causal factor of a defective pixel is the failure of the EL element 15. In addition, when the luminance is lower than an expected luminance, it is possible to detect or determine that a minute pinhole is generated in the EL element.

More specifically, light emission by the EL element 15 is detected using an optical detector in a state in which the ON voltage is being applied to the gate signal line 17a (light emission detecting process). Then, as to a defective pixel in which light emission by the EL element 15 is not detected in the light emission detecting process, the EL element 15 is determined to be a cause of the defect.

Furthermore, by selecting the gate signal line 17d connected to the gate terminal of the transistor 11c for each pixel row, and turning on the transistor 11c for each pixel row, it is possible to identify, for each pixel row, a position in the pixel row at which a defect occurs in the EL element 15. In addition, by concurrently obtaining a change or value of a current flowing through the anode terminal or the cathode terminal, it is possible to detect or determine the degree of the defect.

In the state illustrated in FIG. 9, it is also possible to detect a defect of the transistor, by changing the ON voltage or the OFF voltage of the gate signal line 17d. For example, if the luminance of a pixel to be inspected does not change even when the OFF voltage is changed from −15 (V) to −5 (V), it is possible to detect or determine that a defect occurs in any of the transistors in the pixel circuit.

For example, in the case where the light emission state of the EL element 15 does not change even when the ON voltage of the gate signal line 17d is decreased, it is possible to judge or determine that a defect occurs in the transistor 11d or at another position in the pixel. In addition, in the case where the EL element 15 emits light even when the gate signal line 17d is in an always-OFF state, it is possible to judge or determine that a defect occurs in the transistor 11d or at another position in the pixel.

In addition, in the case where the light emission state of the EL element 15 does not change even when the initial voltage Vini is changed, it is possible to judge or determine that a defect occurs in the transistor 11d or at another position in the pixel.

As described above, it is possible to detect or identify a defect of the transistor or a defect of the EL element 15 in a corresponding pixel, by adjusting, changing, or setting the magnitude of a voltage of the initial voltage Vini, the ON-OFF state of the transistor 11d, or the magnitude of the ON-OFF voltage of the gate signal line 17d.

As described above, it is possible to perform the lighting inspection without depending on a transistor, by turning off the transistor which operates in a normal operation mode and causing the EL element 15 to emit light. In addition, it is possible to detect a defect and a defect position of a transistor or the like in a pixel.

[1-6. Determination of a Defect of a Transistor and an EL Element]

A defect of a pixel is related to a TFT or an organic EL light-emitting element.

It is possible to modify a defective panel to be non-defective, by determining which one of the TFT and the organic EL light-emitting element has a defect, and for example, removing a defective portion using laser trimming.

Figure 10:
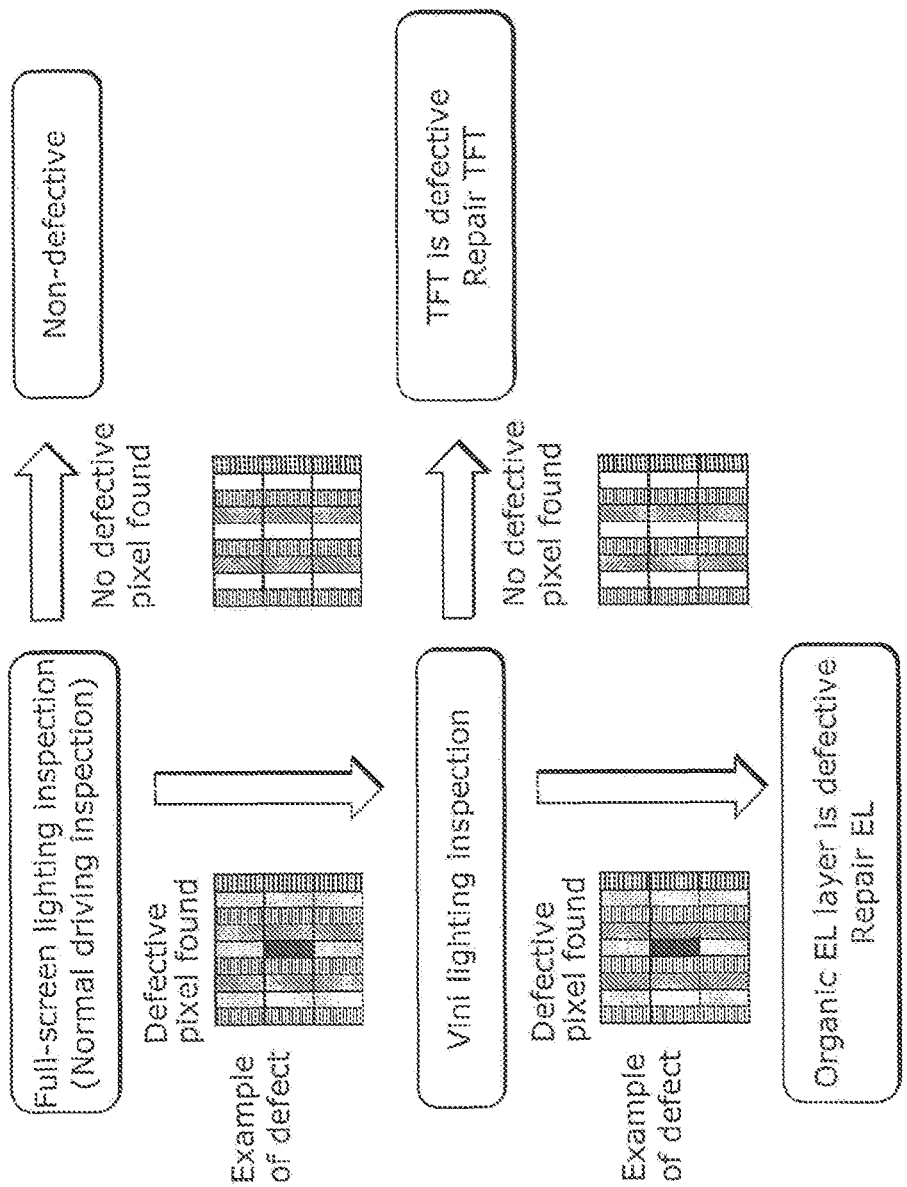
FIG. 10 is a diagram explaining a method of determining a defect of the EL display device according to the embodiment.

FIG. 10 is a diagram explaining a method of determining a defect of the EL display device according to the embodiment.

As illustrated in FIG. 10, in the lighting inspection process of the EL display panel 21, the EL display panel 21 is non-defective when a defect is not found in the pixel 16 by a conventional lighting inspection method (normal driving inspection), and an inspection in which only the transistor 11c illustrated in FIG. 9 is turned on and the initial voltage Vini is applied to the EL element to cause the EL element to emit light (Vini lighting inspection) is performed when a defect is found in the pixel 16 by the conventional lighting inspection method.

As stated in the above-described 1-5, when a defective pixel is detected in the Vini lighting inspection, it is possible to determine that the defect is due to an organic EL light-emitting element, and thus the EL display panel 21 can be modified to be non-defective by repairing the organic EL light-emitting element. On the other hand, when a defective pixel is not detected in the Vini lighting inspection, it is possible to determine that the defect is due to a TFT, and thus the EL display panel 21 can be modified to be non-defective by repairing the TFT.

More specifically, prior to the above-described Vini lighting inspection, all of the pixels 16 disposed on the display screen 20 are first concurrently turned on, thereby detecting a defective pixel (defective pixel detecting process).

Next, light emission by the EL element 15 is detected using an optical detector in a state in which the ON voltage is being applied to the gate signal line 17a (light emission detecting process).

Next, on the basis of a result of the detecting of the light emission by the EL element 15 obtained in the light emission detecting process, which one of the EL element 15 and the transistor has a defect is determined (determination process). More specifically, in the determination process, the transistor (TFT) which is a pixel circuit element other than the EL element 15 is determined to be a cause of the defect when light emission by the EL element 15 of the above-described defective pixel is detected in the light emission detecting process, and the EL element 15 is determined to be a cause of the defect when light emission by the EL element 15 of the above-described defective pixel is not detected in the light emission detecting process.

[1-7. Application Example to Other Pixel Circuits]

[1-7-1. Other Pixel Circuits]

Figure 11:
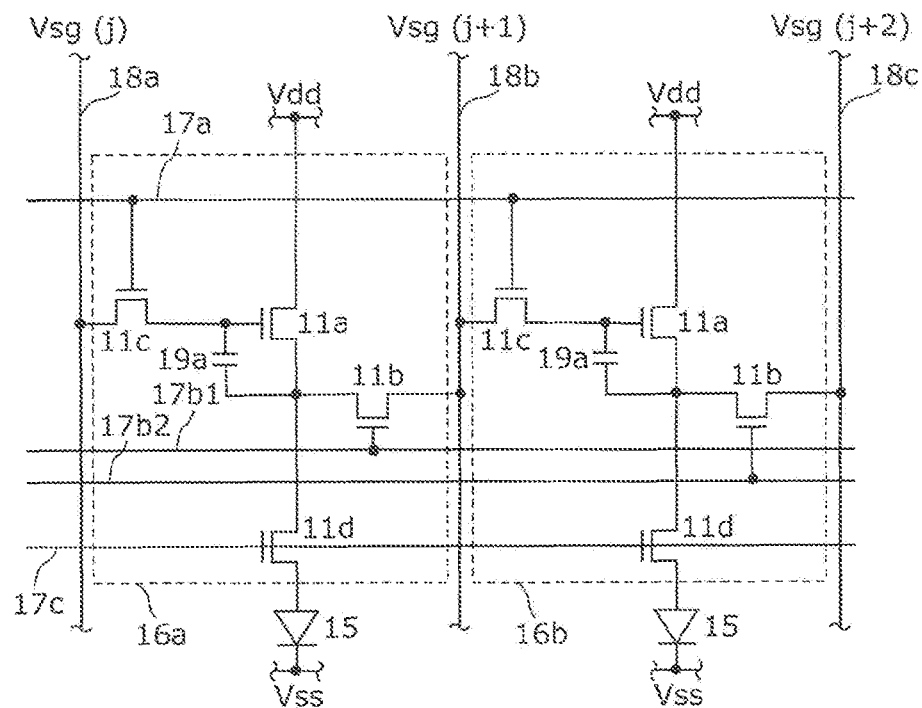
FIG. 11 is a diagram explaining method of inspecting (manufacturing) other pixel circuits according to the embodiment.

FIG. 11 illustrates two pixels 16a and 16b. In practice, the pixels 16a and the pixels 16b are arranged in a matrix in the display screen 20.

The pixels 16a and 16b illustrated in FIG. 11 each include: the EL element 15; the transistor 11a for driving which supplies a drive current to the EL element 15; the transistor 11d; the transistor 11b; the transistor 11c; and the capacitor 19a.

The transistor 11a is a driving transistor including a drain terminal electrically connected via the transistor 11d to the anode voltage Vdd that is the first power line, and a source terminal connected to the drain terminal of the transistor 11d. The transistor 11d has a drain terminal connected to the source terminal of the transistor 11a, and a source terminal electrically connected to the anode terminal of the EL element 15.

The transistor 11a converts a voltage corresponding to a signal voltage applied between the gate terminal and the source terminal into a drain current corresponding to the signal voltage. Then, the transistor 11a supplies this drain current as a signal current to the EL element 15. The transistor 11a is formed of, for example, an n-type thin film transistor (n-type TFT).

The EL element 15 is a light-emitting element including the anode terminal electrically connected to the source terminal of the transistor 11a, and a cathode terminal electrically connected to the cathode voltage Vss that is the second power line. The EL element 15 emits light according to the magnitude of the signal current supplied by the transistor 11a. The magnitude of a signal current is determined by applying a video signal that is applied to the source signal line 18, to the pixel 16a or 16b via the transistor 11c.

The transistor 11b is a second switching transistor including a drain terminal connected to the source terminal of the transistor 11a and a source terminal connected to the source signal line 18. For example, the drain terminal of the transistor 11c of the pixel 16a is connected to the source signal line 18a, and the source terminal of the transistor 11b of the pixel 16a is connected to the source signal line 18b. In addition, the drain terminal of the transistor 11c of the pixel 16b is connected to the source signal line 18b, and the source terminal of the transistor 11b of the pixel 16b is connected to the source signal line 18c.

The transistor 11c includes a source terminal connected to the gate signal of the transistor 11a. The transistor 11c applies a video signal applied to the source signal line, to the gate terminal of the transistor 11a. The capacitor 19a is connected between the gate terminal and the source terminal of the transistor 11a.

The transistor 11d is a first switching transistor including a gate terminal electrically connected to the gate signal line 17c. When an ON voltage is applied to the gate signal line 17c, the transistor 11d is turned on, and a light-emission drive current is supplied to the EL element 15 from the transistor 11a. It should be noted that the transistor 11d may be disposed or formed between the drain terminal of the transistor 11a and the anode voltage Vdd terminal.

The transistor 11c is a third switching transistor including: a gate terminal electrically connected to the gate signal line 17a; a source terminal electrically connected to the gate terminal of the driving transistor 11a; and a drain terminal electrically connected to the source signal line 18. When the ON voltage is applied to the gate signal line 17a, the video signal applied to the source signal line 18 is applied to the gate terminal of the transistor 11a.

The transistor 11b of the pixel 16a includes the gate terminal electrically connected to the gate signal line 17b1, and the transistor 11b of the pixel 16b includes the gate terminal electrically connected to the gate signal line 17b2. In other words, the transistors 11b of adjacent pixels are connected to different gate signal lines.

It should be noted that the channels of the transistors 11a to 11d are bidirectional and the names of the source terminal and the drain terminal are used for the purpose of facilitating the explanation, and thus the source terminal and the drain terminal may be switched. Furthermore, the source terminal and the drain terminal may be referred to as a first terminal and a second terminal, for example.

The capacitor 19a first stores a voltage between the gate electrode and the source electrode of the driving transistor 11a (potential of the source signal line) in a steady state, while the transistor 11b is in a conducting state. The potential of the capacitor 19a is maintained even when the transistor 11b is subsequently placed into the off state, and thus the gate voltage of the transistor 11a is maintained.

The transistor 11b is a transistor which reads the characteristics of the transistor 11a. When reading the characteristics of the transistor 11a of the pixel 16a, the transistor 11d is placed into the off state, and the transistor 11b is place into the on state. In addition, the source signal line 18b is not connected to an output of the source driver circuit 14 (placed into a high impedance state). A current flowing through the channel of the transistor 11a is output to the source signal line 18b via the channel of the transistor 11b. It is possible to measure or evaluate the characteristics of the transistor 11a, by measuring a current that flows through the source signal line 18b.

[1-7-2. Inspection (Manufacturing) Method Performed in Other Pixel Circuits]

A method of inspection (manufacturing) performed in other pixel circuits according to the embodiment illustrated in FIG. 11 will be described.

The following description focuses on the pixel 16a for the purpose of facilitating the explanation. It should be noted that the description regarding the pixel 16a is also applied to the pixel 16b or other pixels arranged in a matrix in the display screen 20.

According to the pixel circuit configuration illustrated in FIG. 11, the transistor 11c is turned OFF, the transistors 11d and 11b are turned on, and an inspection voltage Vsg(j+1) is applied to the source terminal of the transistor 11b. It should be noted that Vsg(j+1) is an inspection voltage. This inspection voltage corresponds to the initial voltage Vini in the circuit illustrated in FIG. 9.

The voltage Vsg(j+1) is applied to the anode terminal of the EL element 15 via the transistors 11b and 11d, by turning on the transistor 11b (voltage applying process) When the EL element 15 operates normally, the EL element 15 emits light according to the voltage Vsg(j+1) applied to the anode terminal of the EL element 15. A current corresponding to a potential difference between the voltage Vsg(j+1) and the cathode voltage Vss flows through the EL element 15. When the cathode voltage Vss is +2 (V), for example, the voltage Vsg(j+1) is set to be +5 (V) or higher.

According to the pixel configuration illustrated in FIG. 7, the voltage Vsig is a video signal voltage, and a video signal is applied from the source driver circuit 14 (not illustrated) to the source signal line 18.

Similarly, the voltage Vsg (Vsg(j), Vsg(j+1), Vsg(j+2), . . . ) in FIG. 11 is also a video signal voltage. More specifically, the source driver circuit 14 applies the video signal voltage to the source signal lines 18a to 18c to perform inspection on the EL element 15. Alternatively, a probe (not illustrated) is pressure-contacted to the source signal lines 18a to 18c, to apply an inspection voltage to each of the source signal lines 18a to 18c. More specifically, the drain terminal of the transistor 11b that belongs to the pixel 16a is connected to the source signal line 18b disposed on the adjacent pixel column. In the above-described voltage applying process, an ON voltage is applied to the gate signal line 18a, thereby an inspection voltage that is the second voltage applied to the source signal line 18b via the transistor 11b is applied to the anode terminal of the EL element 15.

The voltage Vsg can be manually varied at the time of inspection (manufacturing). The current that follows through the EL element 15 increases as the voltage Vsg increases, and the current that follows through the EL element 15 decreases as the voltage Vsg decreases. Accordingly, it is possible to judge whether the EL element 15 passes or fail, and determine the performance of the EL element 15, by optically checking the correlation between values of the voltage Vsg and light emission luminance of the EL element 15.

It should be noted that, the light emission luminance property and the terminal voltage of the EL element 15 vary according to the color (red, green, or blue) of the EL element 15. According to the present embodiment, the voltage Vsg can be separately set according to the color (red, green, or blue) of the EL element 15. This operation is easy in the case where the voltage Vsg is outputted by the source driver circuit 14.

As described above, in the case where the EL element 15 fails to emit light even when the voltage Vsg is applied to the corresponding EL element 15 by turning on the transistors 11b and 11d, the EL element 15 has a short-circuit defect in many cases. Accordingly, it is possible to detect a failure (defect) of the EL element 15, and to determine that a causal factor of a pixel defect is the failure of the EL element 15.

In addition, the gate signal lines 17b1 and 17b2 connected to the gate terminal of the transistors 11b of the pixel 16a and the gate terminal of the transistors 11b of the pixel 16b, respectively, are concurrently or alternately selected for each pixel row. According to this operation, it is possible to identify, for each pixel row, a position in the pixel row at which a defect occurs in the EL element 15, by turning on the transistors 11b and 11d.

In the state illustrated in FIG. 11, it is also possible to detect a defect of the transistor, by changing the ON voltage or the OFF voltage applied to the gate signal lines 17b1 and 17b2.

For example, in the case where the light emission state of the EL element 15 of the pixel 16a does not change even when the ON voltage of the gate signal line 17b1 is decreased, it is possible to judge or determine that a defect occurs in the transistor 11b of the pixel 16a or at another position in the pixel. In addition, in the case where the EL element 15 emits light even when the gate signal line 17d is in an always-OFF state, it is possible to judge or determine that a defect occurs in the transistor 11d or at another position in the pixel. In addition, in the case where the light emission state of the EL element 15 does not change even when the voltage Vsg is changed, it is possible to judge or determine that a defect occurs in the transistor 11a or 11b, or at another position in the pixel.

As described above, it is possible to detect or identify a defect of the transistor or a defect of the EL element 15 in a corresponding pixel, by adjusting, changing, or setting the magnitude of the voltage Vsg, the ON-OFF state of the transistors 11b and 11d, or the magnitude of the ON-OFF voltage of the gate signal lines 17b1, 17b2, and 17c.

As described above, it is possible to perform the lighting inspection without depending on a transistor, by turning off the transistor which operates in a normal operation mode and causing the EL element 15 to emit light. In addition, it is possible to detect a defect of a transistor or the like in a pixel.

INDUSTRIAL APPLICABILITY

The present disclosure is useful especially for a method of manufacturing, and a method of inspecting an active organic EL flat panel display.

The invention claimed is:

1. A method for manufacturing an electroluminescent (EL) display device that includes a display screen in which a plurality of pixels are arranged in a matrix, wherein
   the plurality of pixels each include an EL element, a driving transistor which supplies a current to the EL element, and a switching transistor,
   the EL element includes a first terminal to which a first voltage is applied, and a second terminal, and
   the switching transistor includes a gate terminal connected to a gate signal line, a third terminal connected to the second terminal, and a fourth terminal to which a second voltage is applied, the second voltage having a potential higher than a potential of the first voltage,
   the method comprising:
   applying the second voltage to the second terminal via the switching transistor, by applying an ON voltage to the gate signal line,
   detecting light emission by the EL element, using an optical detector, in a state in which the ON voltage is being applied to the gate signal line;
   detecting a defective pixel by turning on all of the plurality of pixels arranged in the display screen, prior to the applying, and
   determining which one of the EL element and a pixel circuit element other than the EL element has a defect, based on a result of the detecting of the light emission by the EL element, wherein in the determining, the pixel circuit element is determined to be a cause of the defect when the defective pixel includes the EL element whose light emission is detected in the detecting of the light emission, and the EL element is determined to be a cause of the defect when the defective pixel includes the EL element whose light emission is not detected in the detecting of the light emission.

2. The method for manufacturing the EL display device according to claim 1, wherein
the pixel circuit element includes the switching transistor and the driving transistor.

3. The method for manufacturing the EL display device according to claim 1, wherein
in the applying, the second voltage is applied to the second terminal via the switching transistor and bypassing the driving transistor, by applying the ON voltage to the gate signal line.

4. The method for manufacturing the EL display device according to claim 1, wherein
the EL display device includes a source signal line disposed for each of pixel columns of the plurality of pixels, for transmitting a signal voltage reflecting a video signal, to a gate terminal of the driving transistor,
the fourth terminal is connected to the source signal line disposed in an adjacent one of the pixel columns, and
in the applying, the second voltage applied to the source signal line disposed in the adjacent one of the pixel columns is applied to the second terminal via the switching transistor, by applying the ON voltage to the gate signal line.

5. The method for manufacturing the EL display device according to claim 1, wherein
the display screen includes a first gate driver circuit and a second gate driver circuit,
the plurality of pixels each include a second switching transistor for applying a video signal to the driving transistor, the second switching transistor including a gate terminal connected to a second gate signal line, and
the second gate signal line is driven by the first gate driver circuit and the second gate driver circuit.

6. The method for manufacturing the EL display device according to claim 5, wherein
the plurality of pixels each include a third switching transistor for performing an offset cancelling operation of the driving transistor, the third switching transistor including a gate terminal connected to a third gate signal line, and
the third gate signal line is driven by the first gate driver circuit and the second gate driver circuit.

7. The method for manufacturing the EL display device according to claim 6, wherein
the gate signal line which is connected to the gate terminal of the switching transistor is driven by only one of the first gate driver circuit and the second gate driver circuit.

8. The method for manufacturing the EL display device according to claim 7, wherein
one of the first gate driver circuit and the second gate driver circuit is disposed on a left side of the display screen, and
an other of the first gate driver circuit and the second gate driver circuit is disposed on a right side of the display screen.

9. The method for manufacturing the EL display device according to claim 1, wherein
in the detecting of the defective pixel, all of the plurality of pixels arranged in the display screen are concurrently turned on.

10. The method for manufacturing the EL display device according to claim 1, wherein
in the detecting of the light emission by the EL element, only the switching transistor which includes the gate terminal connected to the gate signal line is turned on among transistors of the plurality of pixels.

11. The method for manufacturing the EL display device according to claim 1, further comprising:
in the applying the second voltage to the second terminal via the switching transistor, selecting the gate signal line for each pixel row.

12. The method for manufacturing the EL display device according to claim 1, wherein
the plurality of pixels each include a second switching transistor for applying a video signal to the driving transistor,
the second switching transistor of adjacent pixels of the plurality of pixels is connected to different second gate signal lines, and
the method further comprises:
in the detecting of the defective pixel, concurrently or alternately selecting the different second gate signal lines.

* * * * *